United States Patent [19]

Harada et al.

[11] Patent Number: 5,084,265
[45] Date of Patent: Jan. 28, 1992

[54] PROCESS FOR PREPARING A THIN FILM OF SUPERCONDUCTING COMPOUND OXIDE

[75] Inventors: Keizo Harada; Naoji Fujimori; Shuji Yazu; Tetsuji Jodai, all of Hyogo, Japan

[73] Assignee: Sumitomo Electric Industries, Ltd., Osaka, Japan

[21] Appl. No.: 525,217

[22] Filed: May 16, 1990

Related U.S. Application Data

[63] Continuation of Ser. No. 235,459, Aug. 24, 1988, abandoned.

[30] Foreign Application Priority Data

Aug. 24, 1987 [JP] Japan ................... 62-209841

[51] Int. Cl.$^5$ .................................................. C22B 4/00
[52] U.S. Cl. ................................. 423/592; 75/10.11; 75/10.29; 75/10.64
[58] Field of Search ............... 75/10.13, 10.11, 10.29, 75/10.64; 423/592

[56] References Cited

U.S. PATENT DOCUMENTS

| | | | |
|---|---|---|---|
| 2,265,180 | 12/1941 | Maier | 75/10.29 |
| 2,432,856 | 12/1947 | Brace | 75/10.64 |
| 2,746,420 | 5/1956 | Steigerwald | 75/65 EB |
| 2,932,588 | 4/1960 | Frank | 75/10.13 |
| 3,773,499 | 11/1973 | Melnikov | 75/10.11 |
| 3,997,313 | 12/1976 | Alexander | 75/10.11 |
| 4,488,902 | 12/1984 | Hunt | 75/10.29 |
| 4,888,202 | 12/1989 | Murakami et al. | 14/24 |

OTHER PUBLICATIONS

Koch et al., "Thin Films and Squids made from Y Ba$_2$Cu$_3$O$_y$", Materials Research Society.
Spah et al., "Parameters for In Situ Growth of High T$_c$ Superconducting Thin Film Using an Oxygen Plasma Source", Applied Physics Letters, vol. 53, No. 5, pp. 441-443, Aug. 1, 1988.

Primary Examiner—Peter D. Rosenberg
Attorney, Agent, or Firm—Kerkam, Stowell, Kondracki & Clarke

[57] ABSTRACT

A process for preparing a superconducting thin film of a compound oxide by a process which is similar to MBE technique. In the present process, a plurality of atom beams or molecular beams each contains one element selected from constituent elements of the compound oxide are directed onto a substrate in a predetermined order, so that a plurality of mono-molecular layers are deposited on the substrate.

14 Claims, 5 Drawing Sheets

Tl₂Ba₂CaCu₂O₈

Tl₂Ba₂Ca₂Cu₃O₁₀

PROCESS FOR PREPARING A THIN FILM OF SUPERCONDUCTING COMPOUND OXIDE

This is a continuation of application Ser. No. 235,459, filed Aug. 24, 1988, abandoned.

BACKGROUND OF THE INVENTION

1. Field of the Invention

The present invention relates to a process for preparing a thin film composed of monomoleclar layers. More particularly, it relates to a process which is similar to Molecular Beam Epitaxy (MBE) technique, Atomic Layer Epitaxy (ALE) technique or Molecular Layer Epitaxy (MLE) technique for glowing a series of monomolecular layers on a substrate in a predetermined order.

The process according to the present invention is preferably applicable to a preparation of a superconducting thin film composed of compound oxide.

2. Description of the Related Art

Molecular beam epitaxy (MBE) technique is a kind of vacuum deposition processes and is used for manufacturing a thin film of GaAs, AlAs or the like in the field of semiconductor devices. Atomic or molecular layer epitaxy (ALE or MLE) technique is also proposed for preparing a thin film of GaAs, AlAs or the like by Junichy NISHIZAWA (see Nippon Ketsho Gakaishi (28) 1986, pp. 133–141). Metal-organic vapour phase deposition (MOCVD) technique is also proposed to prepare a thin film of single crystal. In this technique, organometals such as trimethylgallium and arsine are heat-decomposed on a substrate and chemically bonded to a lower layer. The decomposition of organometals may be effected also by photon (see Applied Physics Letter (49) 13 pp. 706–710, May/June 1986).

The superconductivity is a phenomenon which is explained to be a phenomenon of a kind of phase change of electrons under which the electric resistance become zero and the perfect dimagnetism is observed. Thus, under the superconducting condition, electric current of a very high current density can be delivered without any loss of power. The superconducting materials can be used in the fields of electronics, for example, as a device using the Josephson effect in which quantum efficiency is observed macroscopically when an electric current is passed through a weak junction arranged between two superconductors. Tunnel junction type Josephson device which is a typical application of the Josephson effect is expected to be a high-speed and low-power consuming switching device owing to a smaller energy gap of the superconducting material. It is also expected to utilize the Josephson device as a high sensitive sensors or detectors for sensing very weak magnetic field, microwave, radiant ray or the like since variation of electromagnetic wave or magnetic field is reflected in variation of Josephson effect and can be observed as a quantum phenomenon precisely. Development of the superconducting devices is also demanded in the field of high-speed computers in which the power consumption per unit area is reaching to the upper limit of the cooling capacity with increment of the integration density in order to reduce energy consumption.

However, the critical temperature of superconductivity could not exceed 23.2K of $Nb_3Ge$ in which was the highest Tc for the past ten years. The possibility of an existence of new types of superconducting materials having much higher Tc was revealed by Bednorz and Müller, who discovered a new oxide type superconductor in 1986 [Z. Phys. B64 (1986) 189].

The new type compound oxide superconductor discovered by Bednorz and Müller is represented by [La, Sr]$_2$CuO$_4$ which is called $K_2NiF_4$-type oxide having a crystal structure which is similar to known perovskite type oxide. The $K_2NiF_4$-type oxides show such higher Tc as 30K, which are extremely higher than known superconducting materials. It was also reported that C. W. Chu et al discovered, in the United States of America, another superconducting material so called YBCO type represented by $YBa_2Cu_3O_{7-x}$ having the critical temperature of about 90K in February 1987. Still other type new superconducting materials which were reported recently are a compound oxide of Bi—Sr—Ca—Cu—O system and Tl—Ba—Ca—Cu—O system which exhibit such high Tc as more than 100K and which are chemically much stable than the abovementioned YBCO type compound oxide or the like. And hence, the possibility of existence of high-temperature superconductors have burst onto the scene.

A thin film of the above-mentioned new type superconducting material can be prepared by the sputtering technique in which metal elements which are components of the superconducting compound oxide are sputtered and deposited in oxygen atmosphere onto a substrate.

Persons skilled in the art may conceive such an ideal that the MBE technique is the most suitable process for preparing the superconducting thin film of the superconducting compound oxide, since a series of monomolecular layers can be deposited in a predetermined order by the MBE technique.

However, the conventional MBE technique can not apply directly to a preparation of a thin film of the new type superconducting compound oxide, because a crystal of the compound oxide has a plurality of layers each of which contains different elements. Namely, in the conventional techniques of MBE, ALE and MLE, each mono-atom layer to be deposited is composed of only one element to realize a well-ordered crystal structure. For example, in the case when a film film of GaAs composed of two elements is prepared by the conventional MBE technique, these two elements are deposited independently and alternately on a substrate. In other words, these two elements can not be deposited simultaneously.

Still more, a main theme of study in the conventional MBE have been directed to how to control the deposition rate of each layer, in other words, how to terminate each deposition when a monomolecular layer is realized. Furthermore, little study have been done for preparing a thin film of compound oxides because of above-mentioned reasons and also because it is difficult to deposit a monomolecular layer containing oxygen atoms.

An object of the present invention is to provide a process for preparing a the thin film of compound oxide and composed of layered or stratified mono-layers each having a different composition by the MBE technique.

Another object of the present invention to apply the process for a production of a superconducting thin film of the new type compound oxide by the MBE technique.

SUMMARY OF THE INVENTION

The present invention provides a process for preparing a superconducting thin film of a compound oxide, characterized in that a plurality of atom beams or molecular beams each contains at least one element selected from constituent elements of the compound oxide are directed onto a substrate in a predetermined order by means of molecular beam epitaxy (MBE) technique, so that a plurality of monomolecular layers are deposited on the substrate.

The term "atom beam" means a beam consists of single element such as Ba, Sr, Cu and "molecular beam" means a beam consists of more than two elements such as oxides of metal elements, for example BaO, SrO or CuO. These atom beam and molecular beam are produced in the conventional Knudsen Cell (K cell) of a MBE unit. The intensity of the beams can be controlled by adjusting an energy given to the K cell and the composition of the beams can be controlled by varying an atomic ratio of elements used as a vapour source in such manner that each deposited layer possesses a predetermined atomic ratio of elements which correspond to that of one layer in a crystal to be produced.

According to a preferred embodiment, the process is applied for preparing a thin film of a compound oxide represented by the general formula:

$$(\alpha_{1-x}\beta_x)_y\gamma_y O_z$$

in which $\alpha$ stands for an element selected from IIIa group of the Periodic Table, $\beta$ stands for an element selected from IIa group of the Periodic Table, and $\gamma$ stands for an element selected from a group comprising Ib, IIb, IIIb, IVa and VIIIa groups of the Periodic Table, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies a respective range of $0.4 \leq y \leq 3.0$ and $1 \leq z \leq 5$.

The contents of oxygen in the thin film of superconducting compound oxide are an important key factor for realizing the high critical temperature of superconductivity. According to the present invention, the oxygen can be supplied by one of the following techniques:

(1) oxides of the metal elements $\alpha$, $\beta$ and $\gamma$ of the compound oxide, for example BaO, $Y_2O_3$ and CuO are used as vapor sources, (2) oxides which can easily release free oxygen when the oxide arrive at the substrate, such as SbO which is decomposed into Sb and oxygen on the substrate, (3) ionized oxygen beam is supplied from an oxygen ion gun, (4) oxygen atom or molecular is flashed onto the substrate locally in the MBE unit without breakage of vacuum, and (5) organic compound containing oxygen atom therein is physically and/or chemically bonded to a surface of a previously deposited layer, and then a chemical bond between an oxygen and a residual group in the organic compound is cut by suitable energy given by an excimer laser to leave oxygen atom alone on the deposited surface.

In the case of (1) in which the oxygen is supplied in a form of a molecular beam of an oxide, additional oxygen supply is not necessarily required. To the contrary, when the atom beam of an element such as Ba, Sr or Cu is vaporized, oxygen atom must be supplied by any one of the techniques of (2) to (5).

Namely, when the thin film is prepared by the technique (1), three molecular beams each containing the element $\alpha$ and oxygen, the element $\beta$ and oxygen or the element $\gamma$ and oxygen are preferably used. These molecular beams are preferably produced from three vapour sources each composed of an oxide of the element $\alpha$, $\beta$ or $\gamma$ and are directed towards the substrate in the MBE unit in the following order:

1st layer: a mono-molecular layer composed of the element $\gamma$ and oxygen,
2nd layer: a mono-molecular layer composed of the element $\beta$ and oxygen,
3rd layer: a mono-molecular layer composed of the element $\gamma$ and oxygen,
4th layer: a mono-molecular layer composed of the element $\alpha$ and oxygen,
5th layer: a mono-molecular layer composed of the element $\gamma$ and oxygen,
6th layer: a mono-molecular layer composed of the element $\beta$ and oxygen,
7th layer: the same mono-molecular layer as the 1st layer, and then the same order as above from the 2nd layer to the 6th layer is repeated for several times.

When the oxygen is supplied by any one of the techniques of (2) to (5), a mono layer of oxygen is formed after one mono layer of the metal element $\alpha$, $\beta$ or $\gamma$ is deposited by an atom beam on the previous mono layer, so that a mono-layer of oxygen is formed between adjacent two mono layers of metal elements. For example, at first, an atom beam of one of the metal elements, for example Ba, is directed towards the substrate to deposit a first layer of Ba on the substrate. Then, oxygen is supplied onto the first layer of Ba from SbO (in the case of (2)) which is supplied from another K cell, from the oxygen ion gun (in the case of (3)) or by the oxygen flashing (in the case of (4)). Such combination of the atom beam irradiation and oxygen supply is repeated in the above-mentioned order.

In all cases, excess oxygen must be completely removed after monolayer of oxygen is absorbed on a metal layer which is deposited previously, since the MBE technique require a very high vacuum condition such as $10^{-8}$ Torr.

In the case of (3) in which the ionized oxygen atom from the ion gun is used, the ionized oxygen beam can be supplied simultaneously with the atom beam irradiation or deposition.

In the case of (4) in which oxygen is flashed onto a previously produced mono layer, the partial oxygen pressure is preferably modified in the function of adsorption coefficient of metal elements and/or the resulting oxide.

In the case of (5) in which an organic compound is physically absorbed and/or chemically bonded to a previously produced mono layer and then a chemical bond between an oxygen and a residual group in the organic compound is cut by bond breakage energy given by an excimer laser to leave oxygen atom alone on the metal element of the mono layer, the intensity and/or the wave length of the excimer laser is modified to optimize the bond breakage energy. The organic compound containing oxygen atom may be aliphatic or aromatic hydrocarbon having a group or groups of aldehyde, alcohol, carbonoxyl, radical, higher fatty acid, ketone, ester or the like.

In the above-mentioned compound oxide of $(\alpha_{1-x}\beta_x)_y\gamma_yO_z$, the element $\alpha$ is preferably at least one element selected from a group comprising Y, La, Gd, Dy, Ho, Er, Tm, Yb, Nd, Sm, Eu and Lu, the element $\beta$ is preferably Ba or Sr and the element $\gamma$ is preferably Cu. Thus, the preferable compound oxides are Y—Ba—Cu—O system, La—Ba—Cu—O system and La—Sr—Cu—O system including the following special cases:

$Y_1Ba_2Cu_3O_{7-x}$,
$Ho_1Ba_2Cu_3O_{7-x}$,
$Lu_1Ba_2Cu_3O_{7-x}$,
$Sm_1Ba_2Cu_3O_{7-x}$,
$Nd_1Ba_2Cu_3O_{7-x}$,
$Gd_1Ba_2Cu_3O_{7-x}$,
$Eu_1Ba_2Cu_3O_{7-x}$,
$Er_1Ba_2Cu_3O_{7-x}$,
$Dy_1Ba_2Cu_3O_{7-x}$,
$Tm_1Ba_2Cu_3O_{7-x}$,
$Yb_1Ba_2Cu_3O_{7-x}$,
$La_1Ba_2Cu_3O_{7-x}$,
$(La, Sr)_2CuO_{4-x}$ in which x is a number which satisfies a range of $0<x<1$.

The above-mentioned compound oxides possess perovskite type or quasi-perovskite type crystal structure. The term quasi-perovskite type means a structure which can be considered to have such a crystal structure that is similar to perovskite-type oxides and includes an orthohombically distorted perovskite or a distorted oxygen-deficient perovskite or the like.

The substrate may be a sintered block prepared by a sintering technique from a powder mixture having the same composition as the compound oxide to be prepared by the present process. It is also possible to use such a substrate that has a thin film composed of the same compound oxide as a compound oxide to be prepared by the present process. This thin film on the substrate can be prepared by the conventional sputtering technique. Furthermore, the substrate may be made of a single crystal of MgO, $SrTiO_3$, silicon, ceramic such as alumina or even metal. When the substrate of a single crystal is used, the superconducting thin film according to the present invention is preferably deposited on a {001} plane or {110} plane of the single crystal of MgO, $SrTiO_3$ or the like.

The substrate is preferably heated at a temperature between 200° and 1,000° C. during the mono-atom or mono-molecular layers are deposited on the substrate.

It is also preferable that, after the deposition of the thin film according to the present invention complete, the resulting thin film is further heat-treated at a temperature between 200° and 1,000° C. because of the following reasons:

As mentioned above, the superconducting compound oxide possess a unique crystalline structure: oxygen deficient perovskite type structure. If such crystalline structure should be realized in a complete or strict form, all of the following factors must be controlled precisely in the MBE technique:

(a) an atomic ratio between the metal element $\alpha$, $\beta$ or $\gamma$ and oxygen must be controlled in each layer, (b) the deposition must be terminated at a single or mono layer, and (c) the relative position between two adjacent layers along the direction (a-axis and/or b-axis) which is parallel to a surface of the substrate must be controlled precisely. However, such precious control can not be realized by the present MBE technique.

Fortunately, such severe control is not necessarily requested for realization of the superconductivity. In fact, the superconductivity is observed on a sample in which the crystalline structure is realized only locally. In other words, uniformity of the crystalline structure and alignment of a-axis, b-axis and c-axis are not necessarily requested.

According to another preferred embodiment of the present invention, the rearrangement of atoms in the crystalline structure is compensated by the heat-treatment which is carried out after the deposition of the thin film by the MBE technique. This after-treatment is preferably carried out in an oxygen containing atmosphere.

The other type superconducting compound oxides which can be prepared by the process according to the present invention are those illustrated in FIG. 3 (a) and (b). These compound oxides are themselves have been already known and are composed mainly of a compound oxide represented by the formula:

$$\Theta_4(\Phi_{1-q}Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6\leq m\leq 10$ and $4\leq n\leq 8$ respectively, $p=(6+m+n)$, q is a number which satisfies a range of $0<q<1$, and r is a number which satisfied a range of $-2\leq r\leq +2$. This system is considered to be a single phase of the following compound oxide or a mixed phase consisting mainly thereof;

$Bi_4Sr_4Ca_4Cu_6O_{20-r}$,
$Bi_2Sr_2Ca_2Cu_3O_{10-r}$ or
$Tl_4Ba_4Ca_4Cu_6O_{20-r}$,
$Tl_2Ba_2Ca_2Cu_3O_{10-r}$, in which r is a number which satisfies a range of $-2\leq r\leq +2$.

An illustration shown on the left side of FIG. 3 (a) is a schismatical view of a crystal having a formula: $Bi_2Sr_2Ca_1Cu_2O_x$ and $Tl_2Ba_2Ca_1Cu_2O_x$ possessing the critical temperature of superconductivity of about 80K and 100K respectively. An illustration shown in the right side of FIG. 3 (a) is a schematic view of a crystal having a formula: $Bi_2Sr_2Ca_2Cu_3O_x$ or $Tl_2Ba_2Ca_2Cu_3O_x$ possessing the critical temperature of superconductivity of about 120K and 130K respectively. The former crystal contains two layers of CuO, while the later has three layers of CuO.

FIG. 3 (b) illustrates another type superconducting compound oxide having a formula: $Tl_2Ba_2CaCu_2O_8$ or $Tl_2Ba_2Ca_2Cu_3O_{10}$ which is reported by E. I. du Pont de Nemours and Company.

When a compound oxide represented by a formula of $Tl_2Ba_2Ca_2Cu_3O_x$ is prepared by the present invention, each atom beam consisting of one of constituent elements or each molecular beam composed of one of constituent elements and oxygen is directed towards the substrate in the following order:

1st layer: a monomolecular layer composed of Tl (or Bi) and oxygen,

2nd layer: a monomolecular layer composed of Ba (or Sr) and oxygen,

3rd layer: a monomolecular layer composed of Cu and oxygen,

4th layer: a monomolecular layer composed of Ca and oxygen,

5th layer: a monomolecular layer composed of Cu and oxygen,
6th layer: a monomolecular layer composed of Ca and oxygen,
7th layer: a monomolecular layer composed of Cu and oxygen,
8th layer: a monomolecular layer composed of Ba (or Sr) and oxygen,
9th layer: a monomolecular layer composed of Tl (or Bi) and oxygen,
10th layer: a monomolecular layer composed of Tl (or Bi) and oxygen, and then the same order as above is repeated.

One unit consisting of the above-mentioned nine layers from 1st layer to 9th layer is repeated for several times. In the actual crystal which exhibit superior superconductivity, adjacent two units are offset to each other.

Now, two typical MBE units used for preparing a thin film of compound oxide according to the present invention is described with reference to the drawings.

Figure 2A:
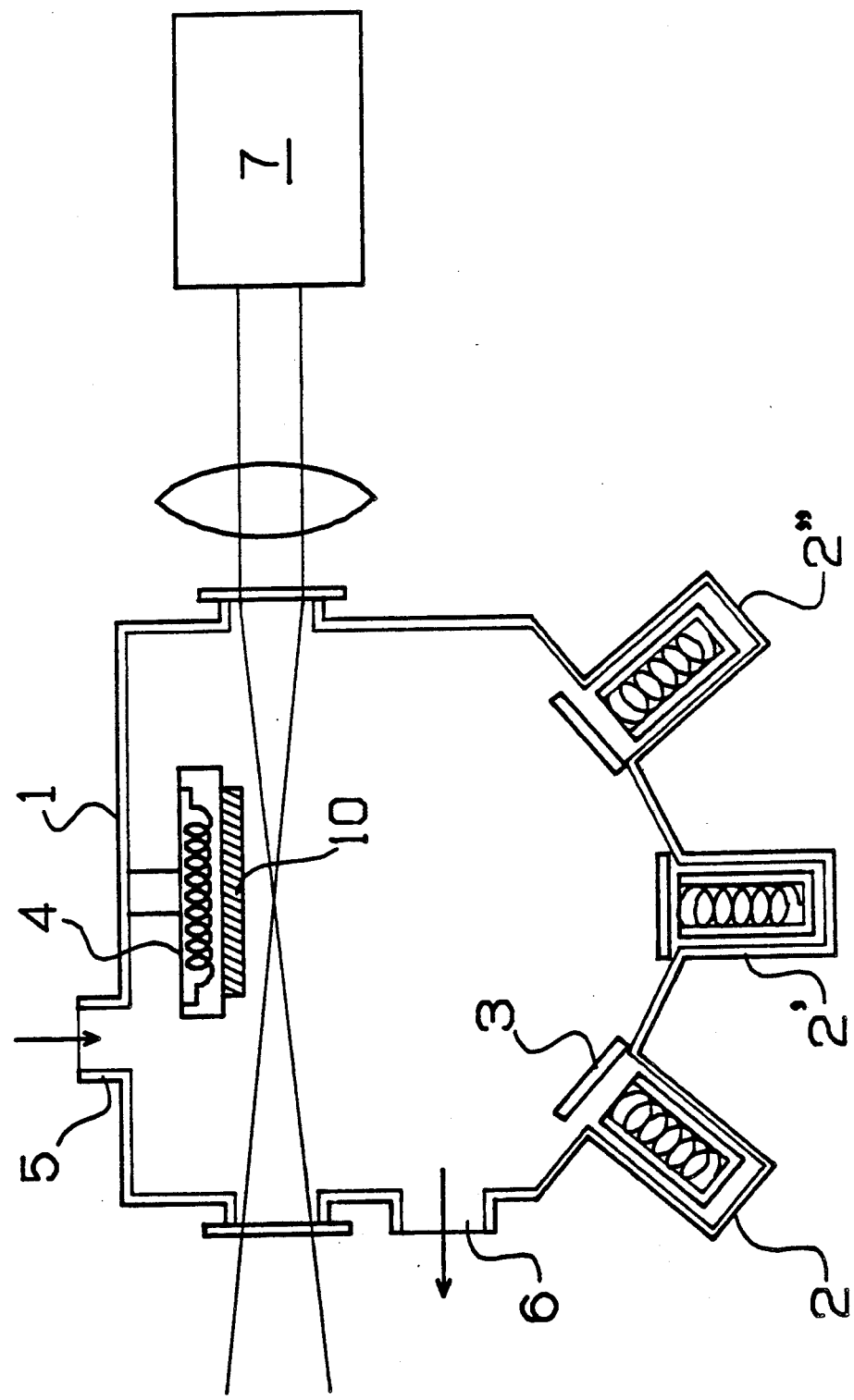
FIG. 2 illustrates a very simplified conventional MBE unit which is used for producing the compound oxide thin film according to the present invention, FIG. 2 (a) shows a MBE unit equipped with an excimer laser and FIG. 2 (b) shows a MBE unit equipped with an oxygen ion gun.
Figure 2B:
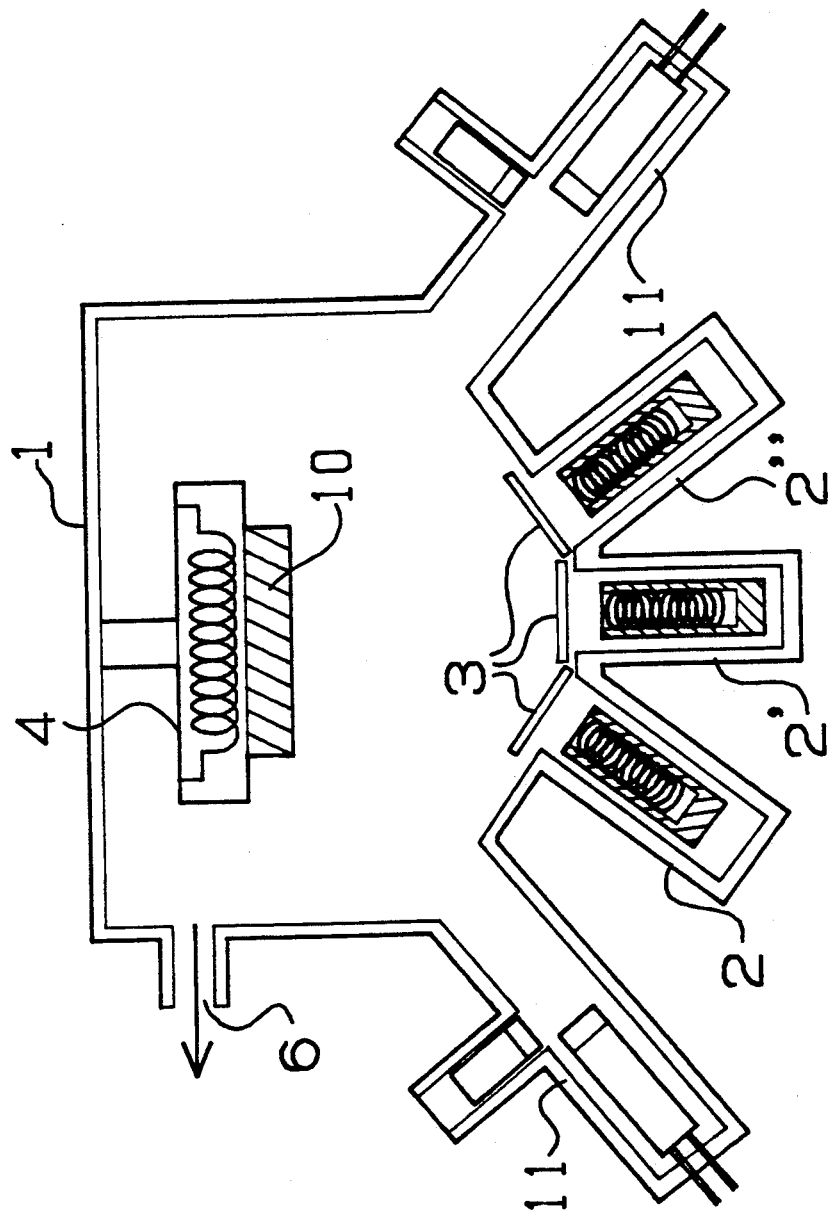
Figure 3A:
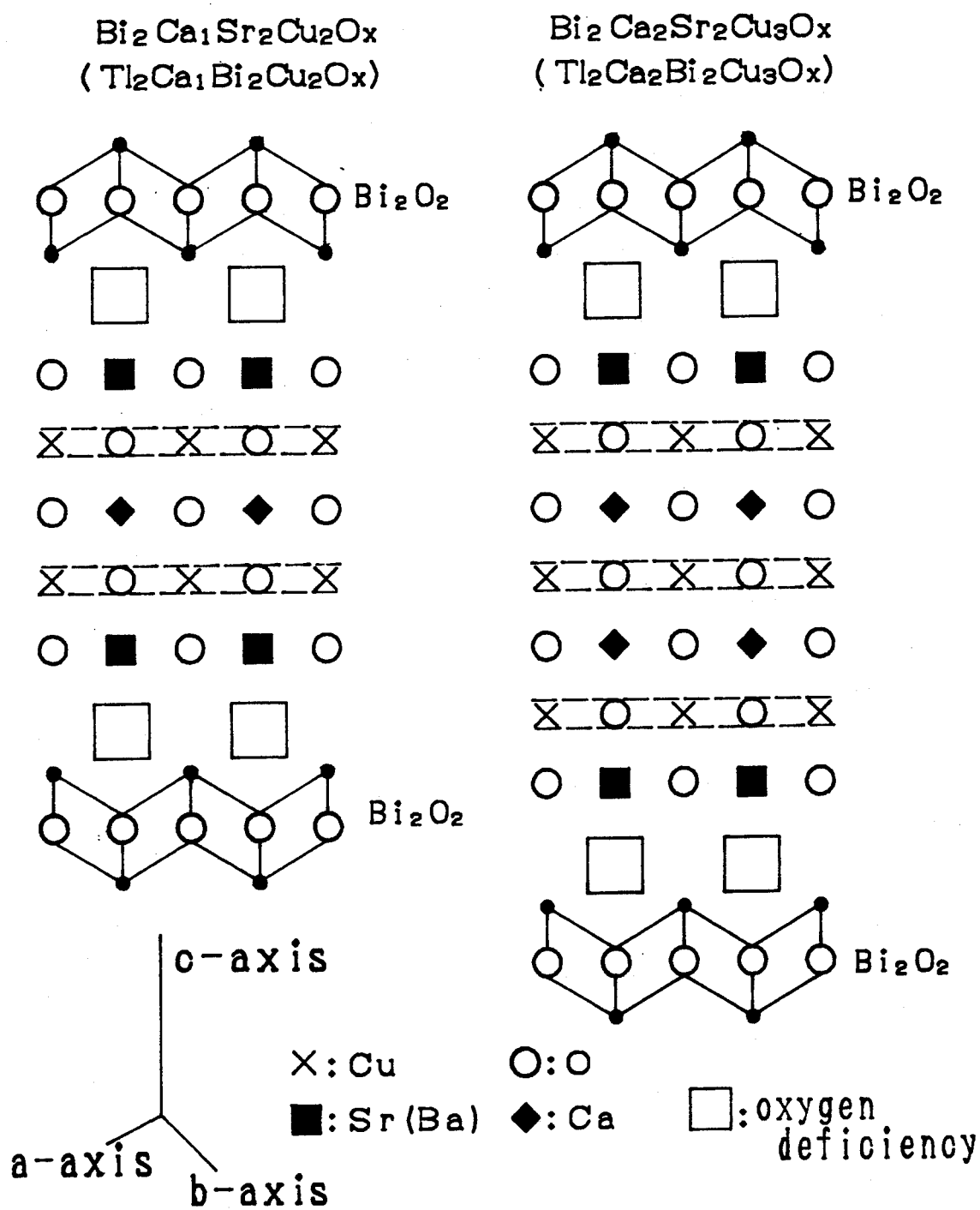
FIG. 3 (a) and (b) illustrate another example of a crystal structure of a compound oxide thin film which is produced according to the present invention.
Figure 3B:
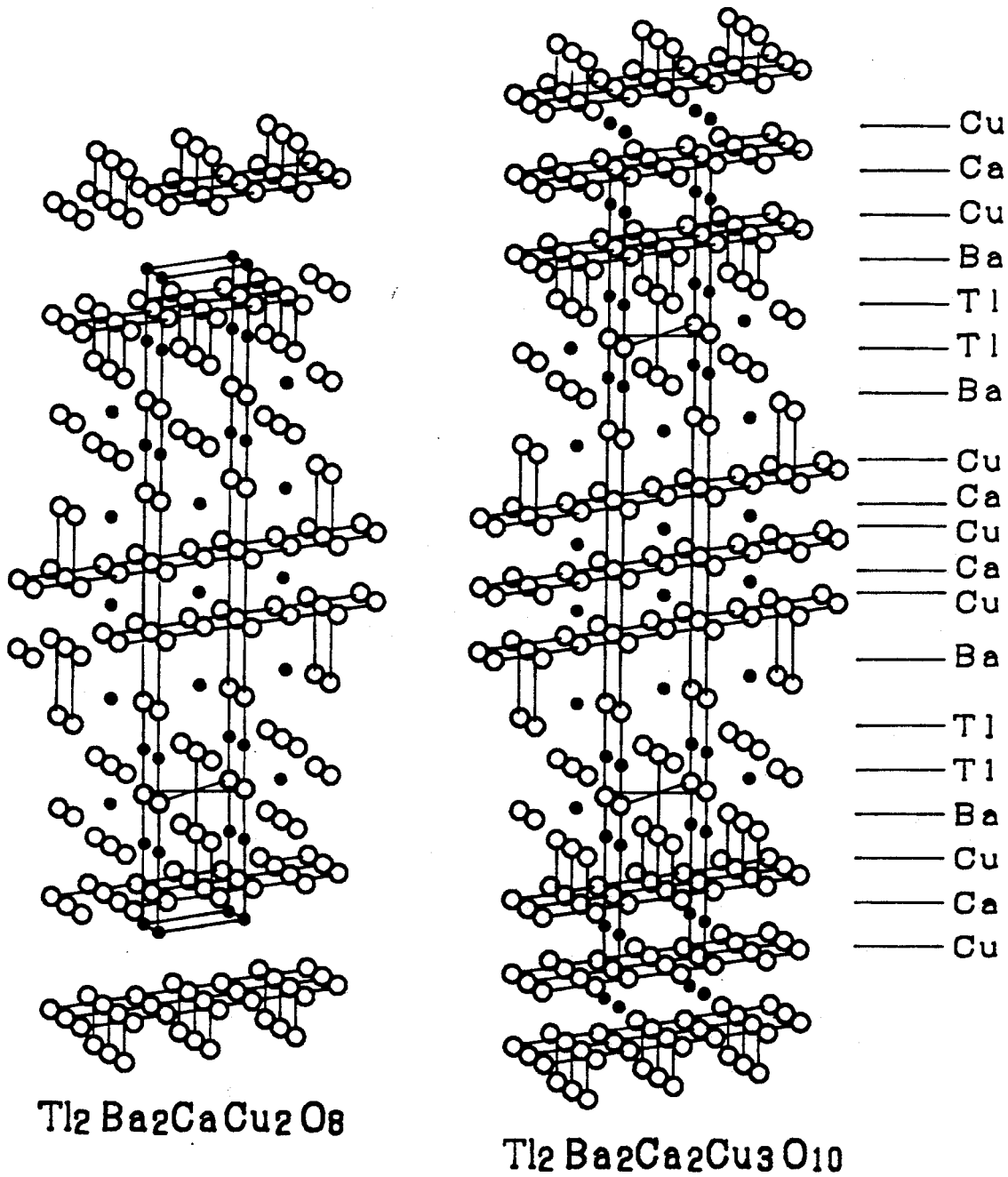

FIG. 2 (a) shows essential parts of a molecular beam epitary unit which is used in the present invention. For clarity, all of control systems including analyzers such as mass spectrometer, an Auger Electron Spectroscopy (AES) are omitted. The other mechanisms such as manipulators, evacuation units or the like are also omitted because they are well-known. The MBE unit shown in FIG. 2 (a) is equipped with an excimer laser 7 which is not used in the conventional type MBE unit.

In operation, after a substrate 10 is secured to a holder 4 whose temperature is controlled by a heater, a vacuum chamber 1 is evacuated through an exhaust manifold 6 to create a pressure of about $10^{-8}$ Torr. Each element to be deposited is evaporated in a K cell, 2, 2' and 2'' and the resulting atom beam or molecular beam is directed towards the substrate 10 when a shutter 3 is opened. Operation of this MBE unit will be described later.

FIG. 2 (b) shows another type MBE unit in which oxygen ion guns 11 from which ionized oxygen is emitted towards the substrate 10 are installed in the chamber 1. This type MBE unit is used in the above-mentioned case (3).

DESCRIPTION OF THE PREFERRED EMBODIMENTS

Now, the present invention is explained in more details with reference to drawings.

Figure 1:
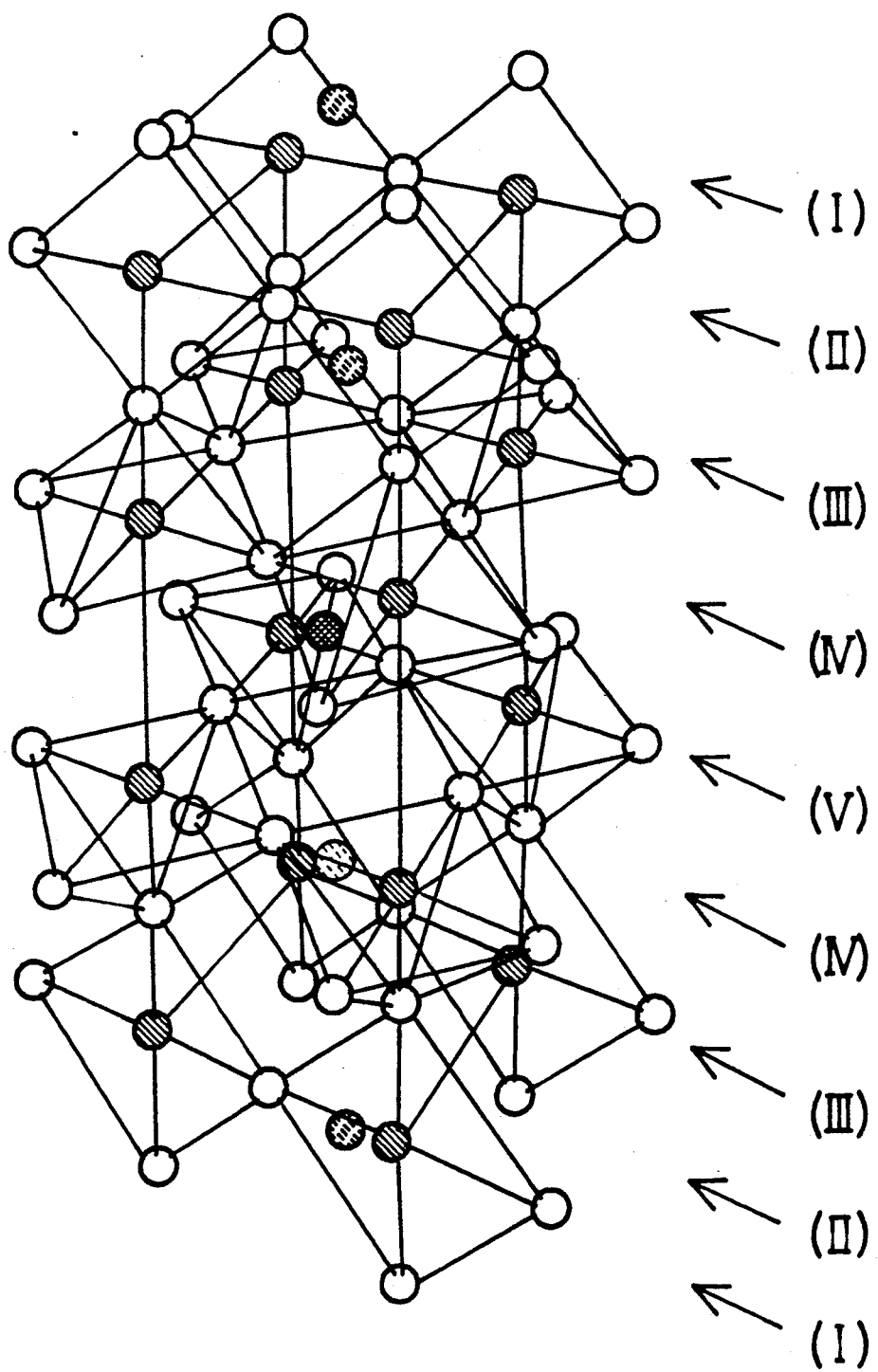
FIG. 1 illustrates an example of a crystal structure of a compound oxide thin film which is produced according to the present invention.

FIG. 1 shows an example of a crystal structure of oxygen deficiency perovskite type superconducting compound oxide which is produced by the present invention. In this crystalline structure, each of an element $\alpha$ of IIIa group, an element $\beta$ of IIa group and at least one element $\gamma$ of Ib, IIb, IIIb, VIIIa or IVa group positions a predetermined site in the crystal through an oxygen atom or without through an oxygen atom.

According to a preferred embodiment of the present invention, the thin film of the compound oxide is prepared by the MBE unit shown in FIG. 2 (b) in which three molecular beams each composed of the element $\alpha$ and oxygen, the element $\beta$ and oxygen or the element $\gamma$ and oxygen are directed towards the substrate. These molecular beams are produced from three K cells 2, 2' and 2'' each containing an oxide of the element $\alpha$, $\beta$ or $\gamma$ (the above-mentioned case (1)) and are directed towards the substrate in the MBE unit in the following order:

1st layer: a mono-molecular layer composed of the element $\gamma$ and oxygen,
2nd layer: a mono-molecular layer composed of the element $\beta$ and oxygen,
3rd layer: a mono-molecular layer composed of the element $\gamma$ and oxygen,
4th layer: a mono-molecular layer composed of the element $\alpha$ and oxygen,
5th layer: a mono-molecular layer composed of the element $\gamma$ and oxygen,
6th layer: a mono-molecular layer composed of the element $\beta$ and oxygen,
7th layer: the same mono-molecular layer as the 1st layer, and then the order of the 2nd layer to the 6th layer is repeated for several times.

The intensity of the beams is controlled by adjusting an energy given to the K cell and the amount of beam to be deposited is controlled by a shutter. Oxygen supply is controlled by any one of the above-mentioned techniques.

In variation, atom beams each composed of one of elements $\alpha$, $\beta$ and $\gamma$ are emitted from three K cells 2, 2' and 2'' each containing one of the element $\alpha$, $\beta$ or $\gamma$ and are directed towards the substrate in the same order as above while an oxygen ion beam is directed towards the substrate from the oxygen ion gun 11 (the abovementioned case (3)).

In another variation, an oxide such as SbO is charged in additional K cell (not shown) and is evaporated after each mono layer is formed. Namely, after the first layer is deposited, a molecular beam of SbO is directed towards the first layer. On the first layer, SbO is decomposed into Sb and oxygen and only oxygen is absorbed by the first layer to react with the atom in the first layer. Then, the second layer is formed. After then, the same operation as above is repeated for supply oxygen which react with the second layer (the above-mentioned case (2)).

In still another variation, the MBE unit shown in FIG. 2 (a) is used. In this case corresponds to the above-mentioned case (5), an organic compound such as aliphatic or aromatic hydrocarbon having a group or groups of aldehyde, alcohol, carbonoxyl radical, higher fatty acid, ketone, ester or the like is fed through a duct (not shown) and is flashed locally onto a deposited layer so that the organic compound is absorbed onto a mono layer of one of the metal elements $\alpha$, $\beta$ and $\gamma$ deposited previously by means of one of the atom beams emitted from three K cells 2, 2' and 2'' each containing one of the elements $\alpha$, $\beta$ or $\gamma$. Then, a chemical bond between an oxygen and a residual group of the organic compound is cut by an excimer laser 7 (FIG. 2 (a)) to leave oxygen atom alone on the metal element. The intensity and/or the wave length of the excimer laser is modified to optimize the bond breakage energy. As mentioned above, since the MBE technique require a very high vacuum condition such as $10^{-8}$ Torr, the residues must be completely removed after mono-layer of oxygen is absorbed on a metal layer.

In the still other variation, oxygen atom or oxygen gas is fed through a duct (not shown) inserted through a manifold 5 and is flashed onto the substrate locally in the MBE unit without breakage of vacuum.

We claim:

1. A process for preparing a superconducting thin film of a compound oxide comprising:

repeating a unit operation for a predetermined number of times to successively form a plurality of monomolecular layers on a substrate;

said operation for forming each unit monomolecular layer comprising the steps of:

directing a beam of a metal element selected from constituent metal elements of said compound oxide onto said substrate or onto a monomolecular layer which has been formed by the previous unit operation, to deposit a monomolecular layer of said metal element; and directing ionized oxygen atoms by an oxygen ion gun, either simultaneously with said directing of said beam of said metal element or immediately after said directing of said beam of said metal element onto said monomolecular layer of said metal element thus deposited, whereby said metal element is changed to an oxide form of said metal by oxidation.

2. A process set forth in claim 1, characterized in that each of said atom beams containing one element selected from constituent elements of the compound oxide is directed towards the substrate to deposit one layer of the selected element and then oxygen atom or molecular is flashed onto the deposited layer locally in the MBE unit without breakage of vacuum.

3. A process set forth in claim 1, characterized in that said substrate is heated at a temperature between 200° and 1,000° C. during the monoatom layers or monomolecular layers are deposited on the substrate.

4. A process set forth in claim 1, characterized in that the thin film obtained is further heat-treated at a temperature between 200° and 1,000° C.

5. A process set forth in claim 1, characterized in that said compound oxide is represented by the general formula:

$$(\alpha_{1-x}\beta_x)\gamma_y O_z$$

in which $\alpha$ stands for an element selected from IIIa group of the Periodic Table, $\beta$ stands for an element selected from IIa group of the Periodic Table, and $\gamma$ stands for an element selected from a group comprising Ib, IIb, IIIb, IVa and VIIIa groups of the Periodic Table, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies a respective range of $0.4 \leq y \leq 3.0$ and $1 \leq z \leq 5$.

6. A process set forth in claim 5, characterized in that the following mono-molecular layers are deposited on the substrate in the following order:

1st layer: a mono-molecular layer composed of said element $\gamma$ and oxygen,
2nd layer: a mono-molecular layer composed of said element $\beta$ and oxygen,
3rd layer: a mono-molecular layer composed of said element $\gamma$ and oxygen,
4th layer: a mono-molecular layer composed of said element $\alpha$ and oxygen,
5th layer: a mono-molecular layer composed of said element $\gamma$ and oxygen,
6th layer: a mono-molecular layer composed of said element $\beta$ and oxygen,
7th layer: the same mono-molecular layer as the 1st layer, and then the same order as above from the 2nd layer to the 6th layer is repeated for several times.

7. A process set forth in claim 5, characterized in that said element $\alpha$ is at least one element selected from a group comprising Y, La, Gd, Dy, Ho, Er, Tm, Yb, Nd, Sm, Eu and Lu and said element $\beta$ is Ba or Sr and said element $\gamma$ is Cu.

8. A process set forth in claim 5, characterized in that the thin film of the compound oxide has a perovskite type or quasi-perovskite type crystal structure.

9. A process set forth in claim 1, characterized in that said substrate is made of a single crystal of MgO or $SrTiO_3$.

10. A process set forth in claim 9, characterized in that said superconducting thin film is deposited on a $\{001\}$ plane or $\{110\}$ plane of a single crystal of MgO or $SrTiO_3$.

11. A process set forth in claim 1, characterized in that thin film is composed essentially of a compound oxide represented by the formula:

$$\Theta_4(\Phi_{1-q}, Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 \leq q \leq 1$, and r is a number which satisfies a range of $-2 \leq r \leq +2$.

12. A process set forth in claim 11, characterized in that the following monomolecular layers are deposited on the substrate in the following order:

1st layer: a monomolecular layer composed of Tl (or Bi) and oxygen,
2nd layer: a monomolecular layer composed of Ba (or Sr) and oxygen,
3rd layer: a monomolecular layer composed of Cu and oxygen,
4th layer: a monomolecular layer composed of Ca and oxygen,
5th layer: a monomolecular layer composed of Cu and oxygen,
6th layer: a monomolecular layer composed of Ca and oxygen,
7th layer: a monomolecular layer composed of Cu and oxygen,
8th layer: a monomolecular layer composed of Ba (or Sr) and oxygen,
9th layer: a monomolecular layer composed of Tl (or Bi) and oxygen,
10th layer: a monomolecular layer composed of Tl (or Bi) and oxygen, and then the same order as above is repeated.

13. A process for preparing a superconducting thin film of a compound oxide, characterized in that a plurality of atom beams or molecular beams each contains one element selected from constituent elements of the compound oxide are directed onto a substrate in a predetermined order by the molecular beam epitaxy (MBE) technique so that a plurality of monomolecular layers of oxides of the selected element are deposited on the substrate successively, and then the thin film obtained is further heat-treated at a temperature between 200° and 1,000° C. in oxygen atmosphere.

14. A process set forth in claim 1, characterized in that each of said atom beams containing one element selected from constituent elements of the compound oxide is directed towards the substrate to deposit one layer of the selected element and then a molecular beam consists of an oxygen containing a compound which can easily release free oxygen when the molecular beam arrives at the substrate is directed to the deposited layer.

* * * * *